United States Patent
Jeong

(10) Patent No.: US 8,421,098 B2
(45) Date of Patent: Apr. 16, 2013

(54) SEMICONDUCTOR LIGHT EMITTING DEVICE HAVING A ROUGHNESS ON A CHANNEL LAYER

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 372 days.

(21) Appl. No.: 12/705,432

(22) Filed: Feb. 12, 2010

(65) Prior Publication Data
US 2010/0207151 A1   Aug. 19, 2010

(30) Foreign Application Priority Data
Feb. 16, 2009 (KR) .......... 10-2009-0012483

(51) Int. Cl.
*H01L 33/22* (2010.01)
*H01L 33/42* (2010.01)

(52) U.S. Cl.
USPC ........... 257/91; 257/E33.074; 257/79; 257/81

(58) Field of Classification Search ........... 257/78, 257/79, 98, 81, 91, E33.074
See application file for complete search history.

(56) References Cited

U.S. PATENT DOCUMENTS

| | | | |
|---|---|---|---|
| 2004/0104390 A1* | 6/2004 | Sano et al. | 257/78 |
| 2005/0082562 A1* | 4/2005 | Ou et al. | 257/103 |
| 2006/0027815 A1* | 2/2006 | Wierer et al. | 257/79 |
| 2006/0163599 A1 | 7/2006 | Tsai et al. | |
| 2006/0202219 A1* | 9/2006 | Ohashi et al. | 257/98 |
| 2007/0114511 A1 | 5/2007 | Kim et al. | |
| 2007/0145385 A1* | 6/2007 | Ohashi et al. | 257/79 |
| 2007/0202624 A1* | 8/2007 | Yoon et al. | 438/29 |
| 2008/0169482 A1* | 7/2008 | Kang | 257/98 |
| 2009/0146165 A1* | 6/2009 | Hasnain et al. | 257/98 |
| 2009/0294784 A1 | 12/2009 | Nakahara et al. | |
| 2010/0124797 A1 | 5/2010 | Lee | |
| 2010/0208763 A1 | 8/2010 | Engl et al. | |
| 2010/0224892 A1 | 9/2010 | Nakahara | |

FOREIGN PATENT DOCUMENTS

| | | |
|---|---|---|
| KR | 10-0452749 B1 | 10/2004 |
| KR | 10-2006-0035424 A | 4/2006 |
| KR | 10-2008-0065666 A | 7/2008 |
| KR | 10-2008-0087135 A | 9/2008 |
| WO | WO 2008/135013 A2 | 11/2008 |

* cited by examiner

*Primary Examiner* — Fernando L Toledo
*Assistant Examiner* — Peter Bradford
(74) *Attorney, Agent, or Firm* — Birch, Stewart, Kolasch & Birch, LLP

(57) ABSTRACT

Disclosed is a semiconductor light emitting device. The semiconductor light emitting device includes a light emitting structure including a first conductive semiconductor layer, an active layer below the first conductive semiconductor layer, and a second conductive semiconductor layer below the active layer; a channel layer below the light emitting structure, in which an inner portion of the channel layer is disposed along an outer peripheral portion of the light emitting structure and an outer portion of the channel layer extends out of the light emitting structure; and a second electrode layer below the light emitting structure.

19 Claims, 9 Drawing Sheets

SEMICONDUCTOR LIGHT EMITTING DEVICE HAVING A ROUGHNESS ON A CHANNEL LAYER

CROSS-REFERENCE TO RELATED APPLICATIONS

The present application claims the benefit under 35 U.S.C. §119 of Korean Patent Application No. 10-2009-0012483, filed Feb. 16, 2009, which is hereby incorporated by reference in its entirety.

BACKGROUND

The embodiment relates to a semiconductor light emitting device and a method of manufacturing the same.

Groups III-V nitride semiconductors have been extensively used as main materials for light emitting devices, such as a light emitting diode (LED) or a laser diode (LD), due to the physical and chemical characteristics thereof. For example, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a semiconductor light emitting device and a method of manufacturing the same, capable of improving a light extraction angle in a lateral direction of a light emitting structure.

The embodiment provides a semiconductor light emitting device and a method of manufacturing the same, capable of improving a light extraction angle of light emitted in a lateral direction of a light emitting structure by forming roughness on an outer surface of the light emitting structure.

A semiconductor light emitting device according to the embodiment includes a light emitting structure including a first conductive semiconductor layer, an active layer below the first conductive semiconductor layer, and a second conductive semiconductor layer below the active layer; a channel layer below the light emitting structure, in which an inner portion of the channel layer is disposed along an outer peripheral portion of the light emitting structure and an outer portion of the channel layer extends out of the light emitting structure; and a second electrode layer below the light emitting structure.

A semiconductor light emitting device according to the embodiment includes a light emitting structure including a first conductive semiconductor layer, an active layer below the first conductive semiconductor layer, and a second conductive semiconductor layer below the active layer; a channel layer below the light emitting structure, in which an inner portion of the channel layer is disposed along an outer peripheral portion of the light emitting structure, an outer portion of the channel layer extends out of the light emitting structure, and a roughness is formed on an outer portion of a top surface of the channel layer; a first electrode on the light emitting structure; and a second electrode layer below the light emitting structure.

A method of manufacturing a semiconductor light emitting device according to the embodiment includes forming a light emitting structure using a plurality of compound semiconductor layers; forming a roughness on an outer surface of the light emitting structure; forming a channel layer on an outer portion of a top surface of the light emitting structure and the roughness; forming a second electrode layer on the channel layer and the light emitting structure, and exposing an outer portion of the channel layer by removing an outer peripheral portion of the light emitting structure through a mesa etching.

The embodiment can improve light emitting efficiency in the lateral direction.

The embodiment can improve a light extraction angle of a light emitting device.

The embodiment can improve external light emitting efficiency.

DETAILED DESCRIPTION OF THE EMBODIMENTS

Figure 1:
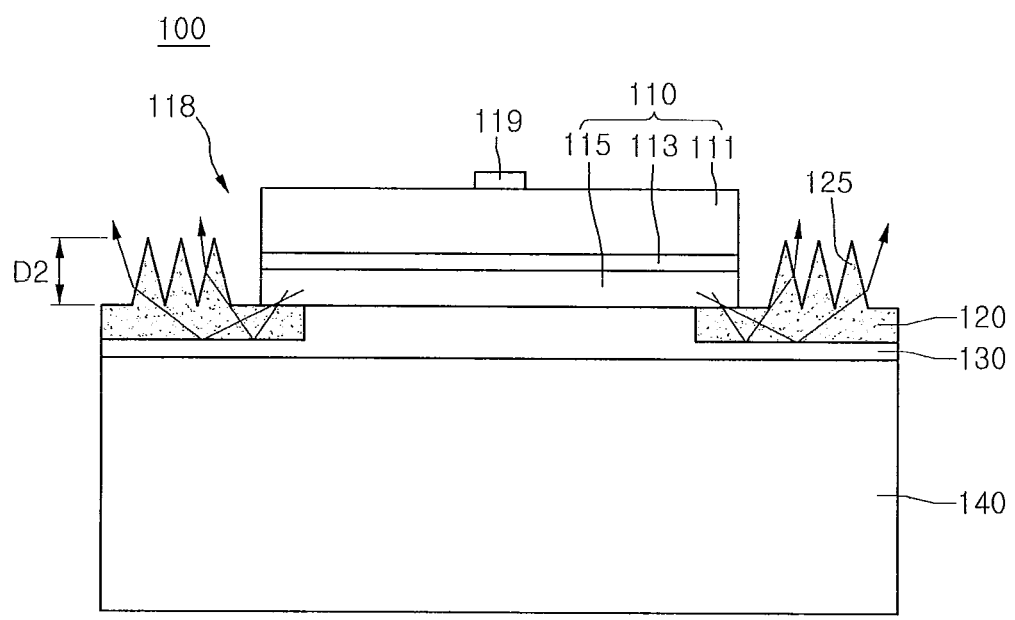
FIG. 1 is a side sectional view showing a semiconductor light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, the embodiments will be described with reference to the accompanying drawings.

FIG. 1 is a side sectional view showing a semiconductor light emitting device according to the embodiment.

Referring to FIG. 1, the semiconductor light emitting device 100 according to the embodiment includes a light emitting structure 110, a channel layer having a roughness 125, a second electrode layer 130 and a conductive support member 140.

The light emitting structure 110 includes a first conductive semiconductor layer 111, an active layer 113, and a second conductive semiconductor layer 115. The active layer 113 is interposed between the first and second conductive semiconductor layers 111 and 115.

The first conductive semiconductor layer 111 may include at least one semiconductor layer doped with a first conductive dopant. The first conductive semiconductor layer 111 may include a group III-V compound semiconductor. For instance, the first conductive semiconductor layer 111 may be formed of at least one selected from the group consisting of GaN, InN, AlN, InGaN, AlGaN, InAlGaN and AlInN. If the first conductive semiconductor layer 111 is an N type semiconductor layer, the first conductive dopant is an N type dopant. For instance, the N type dopant can be selected from the group V elements.

A first electrode 119 is disposed on the top surface of the first conductive semiconductor layer 111. The roughness can be formed on a part or a whole area of the top surface of the first conductive semiconductor layer 111.

The active layer 113 is formed below the first conductive semiconductor layer 111. The active layer 113 has a single quantum well structure or a multiple quantum well (MQW) structure. The active layer 113 may have a stack structure including a well layer and a barrier layer, which are made from group III-V compound semiconductor material. For instance, the active layer 113 has a stack structure of InGaN well/GaN barrier layers or AlGaN well/GaN barrier layers.

The active layer 113 is made from material having band gap energy according to wavelength of light to be emitted. For instance, in the case of blue light having wavelength of 460 to 470 nm, the active layer 113 has a single quantum well structure or a multiple quantum well structure including the InGaN well/GaN barrier layers. The active layer 113 may include material capable of providing light of visible ray band, such as blue light, red light and green light.

A conductive clad layer may be formed on and/or under the active layer 113. The conductive clad layer may include an AlGaN layer.

The second conductive semiconductor layer 115 is disposed below the active layer 113. The second conductive semiconductor layer 115 includes at least one semiconductor layer doped with the second conductive dopant. The second conductive semiconductor layer 115 may include a group III-V compound semiconductor. For instance, the second conductive layer 115 may be formed of at least one selected from the group consisting of GaN, InN, AlN, InGaN, AlGaN, InAlGaN and AlInN. If the second conductive semiconductor layer 115 is a P type semiconductor layer, the second conductive dopant is a P type dopant. For instance, the P type dopant can be selected from the group III elements.

A third conductive semiconductor layer (not shown) can be formed on the second conductive semiconductor layer 115. If the first conductive semiconductor layer 111 is a P type semiconductor layer, the second conductive semiconductor layer 115 is an N type semiconductor layer. The third conductive semiconductor layer may be doped with the first conductive dopant. The light emitting structure 110 may include one of an N-P junction structure, a P-N junction structure, an N-P-N junction structure, and a P-N-P junction structure.

The channel layer 120 and the second electrode 130 are aligned below the second conductive semiconductor layer 115.

An inner portion of the channel layer 120 is disposed below the second conductive semiconductor layer 115 along an outer peripheral portion of the second conductive semiconductor layer 115. An outer portion of the channel layer 120 extends out of the second conductive semiconductor layer 115 so that the channel layer 130 is exposed at an outer peripheral region 118 of the light emitting structure 110.

The channel layer 120 may be formed of conductive material or insulating material having light transmittive property. The channel layer 120 is prepared in the form of a frame and is disposed between the second conductive semiconductor layer 115 and the second electrode layer 130.

The channel layer 120 may include conductive material selected from the group consisting of ITO, IZO, IZTO, IAZO, IGZO, IGTO, AZO and ATO. In addition, the channel layer 120 may include insulating material selected from the group consisting of $SiO_2$, $SiO_x$, $SiO_xN_y$, $Si_3N_4$, $Al_2O_3$ and $TiO_2$.

When the channel layer 120 includes the insulating material, the gap between the second electrode layer 130 and the light emitting structure 110 can be widened. In addition, the channel layer 120 may improve adhesive property relative to the second conductive semiconductor layer 115.

Since the channel layer 120 is exposed through an isolation etching process when the mesa etching is performed later, the channel layer 120 may be referred to as an isolation layer. In addition, since the channel layer 120 serves as an etching stopper during the isolation etching process, the channel layer 120 may be referred to as an etching stop layer.

The roughness 125 is formed on the channel layer 120. The roughness 125 may have various sectional shapes, such as a conical shape, a triangular shape, a polygonal shape, a convex lens shape or a random shape. The roughness 125 refers to a non-planar or non-even surface. The roughness 125 may include a protruding structure formed through a patterning process. The roughness 125 may include a plurality of protrusions, which are regularly or irregularly protruded, and can be inclined with respect to a vertical line.

If the roughness 125 is made from the insulating material, the roughness 125 can make contact with the outer surface of the light emitting structure 110. In addition, if the roughness 125 is made from the conductive material, the roughness 125 is spaced apart from the light emitting structure by a predetermined distance.

The roughness 125 of the channel layer 120 may be provided corresponding to one side, two opposite sides or all sides of the light emitting structure 110. In addition, the roughness 125 of the channel layer 120 may be provided corresponding to both sides (for instance, left and right sides and/or front and rear sides) of light emitting structure 110 with asymmetrical size and shape.

The roughness 125 of the channel layer 120 may protrude by a predetermined height D2. For instance, the predetermined height D2 is 50 nm or above. The top surface of the roughness 125 is located higher than the top surface of the active layer 113.

The channel layer 120 and the roughness 125 may vary the incident angle of light, which is emitted in the lateral direction of the light emitting structure 110 or reflected from the second electrode layer 130, thereby improving the external light emitting efficiency.

The second electrode layer 130 is formed below the second conductive semiconductor layer 115 and the channel layer 120. The second electrode layer 130 may be formed of at least one layer including at least one selected from the group consisting of Ag, Ni, Al, Rh, Pd, Ir, Ru, Mg, Zn, Pt, Au, Hf and combination thereof.

An ohmic layer (not shown) having a predetermined pattern can be formed between the second electrode layer 130 and the second conductive semiconductor layer 115. The ohmic layer may have a matrix pattern, a cross pattern, a polygonal pattern or a circular pattern. The ohmic layer may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide) and ATO (antimony tin oxide).

The conductive support member 140 is formed below the second electrode layer 130. The conductive support member 140 may be formed of material selected from the group consisting of copper, gold, and carrier wafers (for instance, Si, Ge, GaAs, ZnO, and SiC).

FIGS. 2 to 9 are views showing the procedure for manufacturing the semiconductor light emitting device according to the embodiment.

Figure 2:
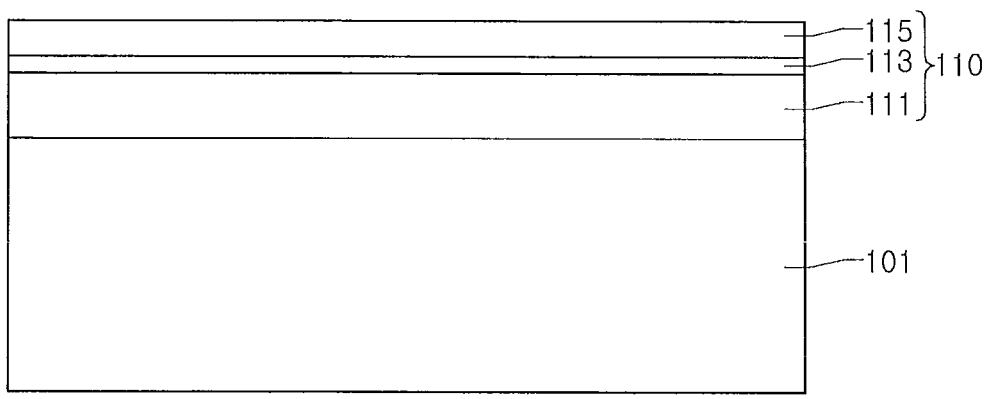
FIGS. 2 to 9 are views showing the procedure for manufacturing a semiconductor light emitting device according to the embodiment.

Referring to FIG. 2, the first conductive semiconductor layer 111 is formed on a substrate 101, and the active layer 113 is formed on the first conductive semiconductor layer 111. The second conductive semiconductor layer 115 is formed on the active layer 113.

The substrate 101 may be formed of material selected from the group consisting of $Al_2O_3$, GaN, SiC, ZnO, Si, GaP, InP and GaAs. A predetermined concave-convex pattern can be formed on the substrate 101. Another semiconductor layer, such as a buffer layer and/or an undoped semiconductor layer, can be formed on the substrate 101 without limitation.

If the first conductive semiconductor layer 111 is an N type semiconductor layer, the second conductive semiconductor layer 115 is a P type semiconductor layer. In contrast, if the first conductive semiconductor layer 111 is a P type semiconductor layer, the second conductive semiconductor layer 115 is an N type semiconductor layer. Another semiconductor layer, such as a buffer layer and/or an undoped semiconductor layer, can be formed between the substrate 101 and the first conductive semiconductor layer 111. This semiconductor layer is removed or separated after the thin film has been grown.

Figure 3:
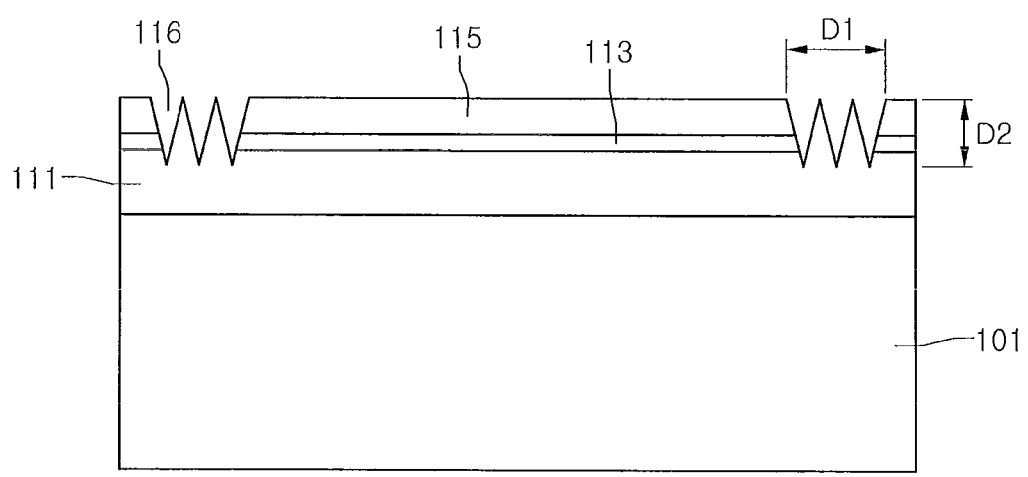

Referring to FIG. 3, a roughness 116 is formed on an outer portion of the top surface of the second conductive semiconductor layer 115. The roughness 116 is formed along an upper outer portion of the second conductive semiconductor layer 115 by a predetermined depth D2. The predetermined depth D2 is 500 nm or above. In addition, a predetermined portion of the first conductive semiconductor layer 111 may be exposed due to the roughness 116.

The width D1 of the roughness 116 in the second conductive semiconductor layer 115 must be set such that the roughness function can be realized without exerting an influence upon the light emitting area. For instance, width D1 of the roughness 116 is in the range of 1000 Å to 5000 Å.

The roughness 116 refers to a non-planar surface. The roughness 116 may include a protruding structure formed through a patterning process. The roughness 116 can be formed by dry-etching the second conductive semiconductor layer 115. The dry-etching is performed in a state in which a mask pattern having a predetermined shape has been formed on the second conductive semiconductor layer 115. In addition, the dry-etching can be performed in a state in which an irregular layer has been formed on the second conductive semiconductor layer 115. The irregular layer may include a photoresist layer or a metal layer.

The roughness 116 may have various sectional shapes, such as a reverse-conical shape, a polygonal shape, a concave lens shape or a random shape. A plurality of roughness 116 can be regularly or irregularly provided.

The roughness 116 is formed at a boundary area between individual chips. For instance, the roughness 116 may be provided corresponding to one top side, two opposite top sides or all top sides of the light emitting structure 110 without limitation. In addition, the roughness 116 may be provided corresponding to both sides (for instance, left and right sides and/or front and rear sides) of light emitting structure 110 with asymmetrical size and shape.

Figure 4:
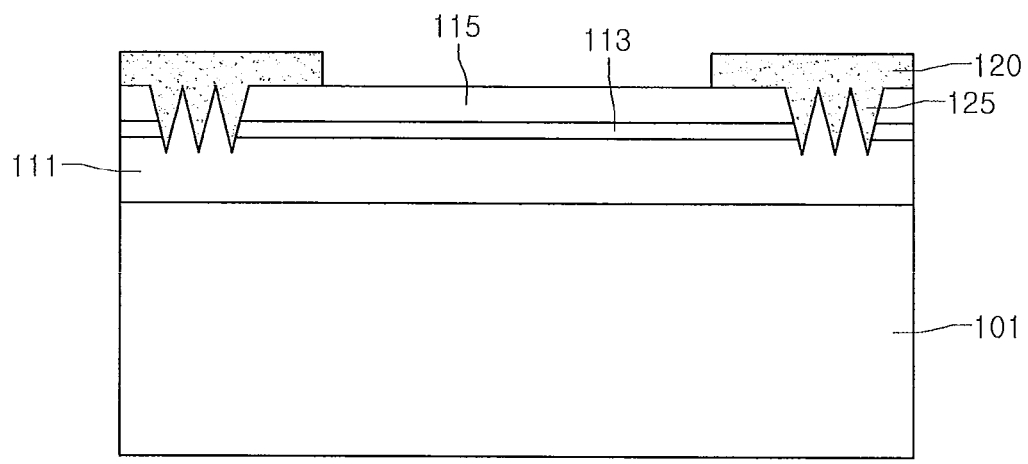

Referring to FIGS. 3 and 4, the channel layer 120 is formed on an outer peripheral portion of the top surface of the second conductive semiconductor layer 115. The channel layer 120 may be formed of material selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

The channel layer 120 is formed with the roughness 125 having the shape corresponding to the shape of the roughness 116. The roughness 125 is formed on the outer peripheral portion of the second conductive semiconductor layer 115, the active layer 113 and the first conductive semiconductor layer 111.

The channel layer 120 is prepared in the form of a frame and is disposed on an outer peripheral portion of the second conductive semiconductor layer 115 of an individual chip. The channel layer 120 and the roughness 125 may be formed by using the same material or two different materials.

Figure 5:
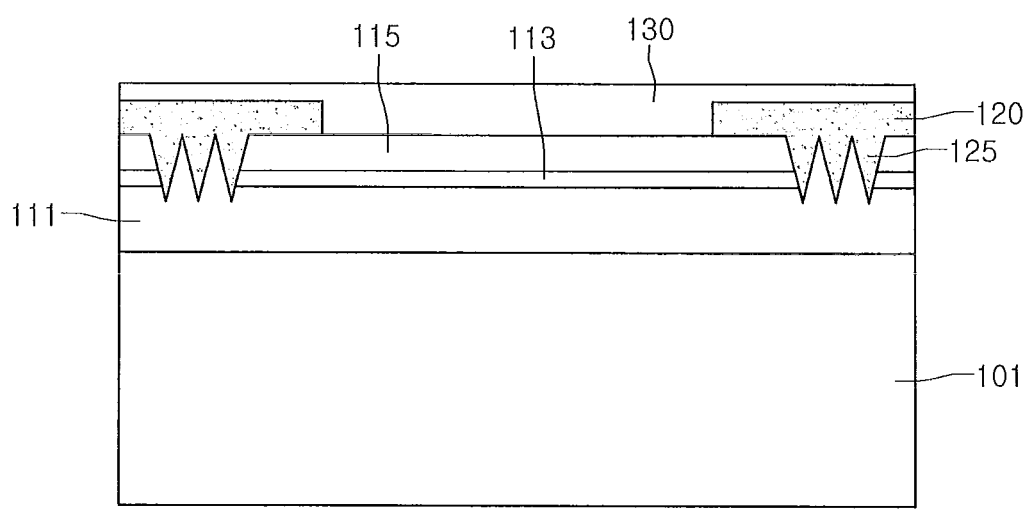
Figure 6:
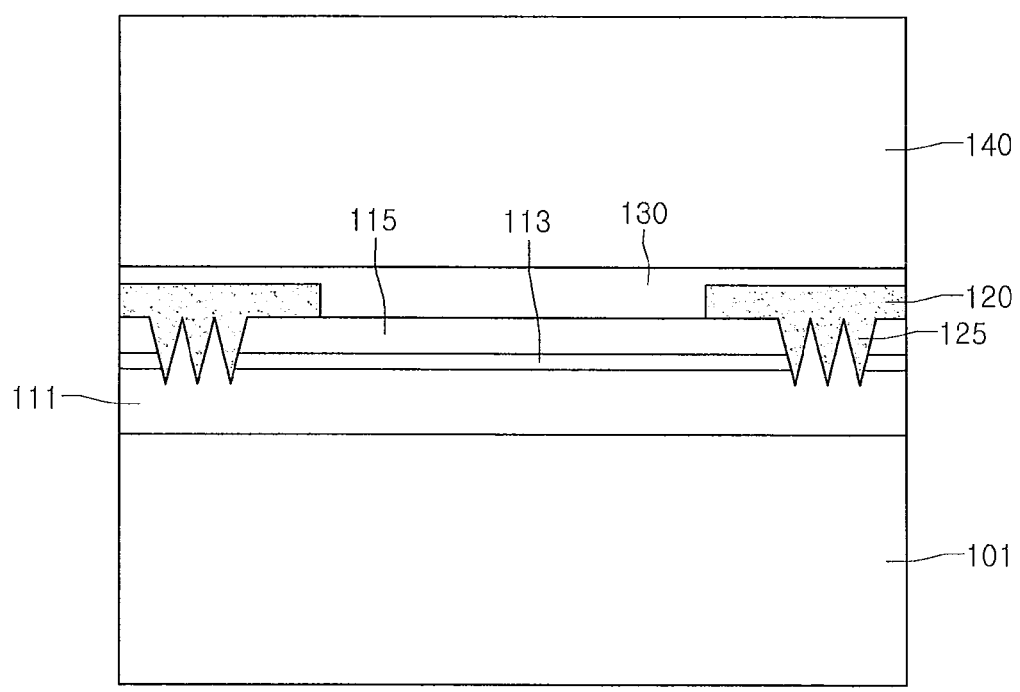

Referring to FIGS. 5 and 6, the second electrode layer 130 is formed on the channel layer 130 and the second conductive semiconductor layer 115, and the conductive support member 140 is formed on the second electrode layer 130.

The second electrode layer 130 and the conductive support member 140 are conductive layers that serve as a second electrode. An ohmic layer (not shown) having a predetermined pattern can be formed between the second conductive semiconductor layer 115 and the second electrode layer 130.

The second electrode layer 130 may be formed of at least one layer including at least one selected from the group consisting of Ag, Ni, Al, Rh, Pd, Ir, Ru, Mg, Zn, Pt, Au, Hf and combination thereof. The conductive support member 140 may be formed with a predetermined thickness by using material selected from the group consisting of copper, gold, and carrier wafers (for instance, Si, Ge, GaAs, ZnO, and SiC).

Figure 7:
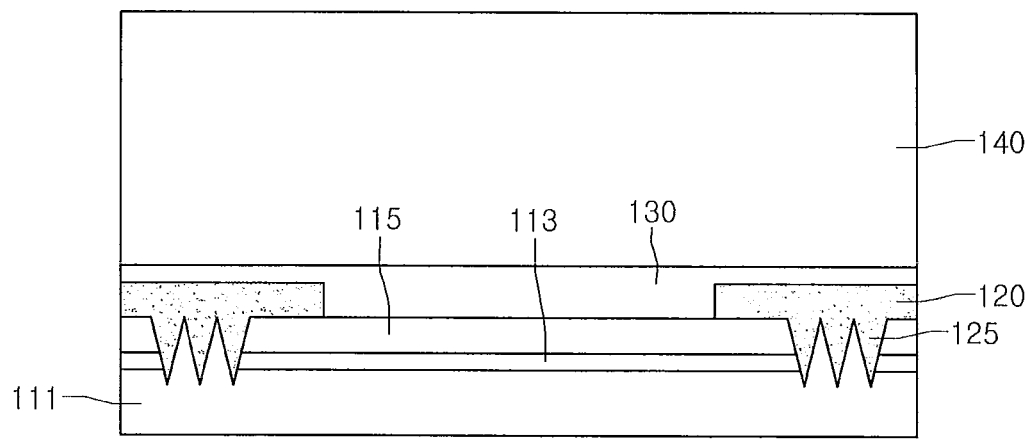

Referring to FIGS. 6 and 7, the substrate 101 disposed below the first conductive semiconductor layer 111 is removed through the laser lift off (LLO) scheme. That is, if the laser having a predetermined wavelength band is irradiated onto the substrate 101, a thermal energy is concentrated on the boundary surface between the substrate 101 and the first conductive semiconductor layer 111, so that the substrate 101 is separated from the first conductive semiconductor layer 111. The substrate 101 can be removed through another scheme. For instance, if another semiconductor layer, such as a buffer layer, exists between the substrate 101 and the first conductive semiconductor layer 111, wet etchant is injected into the buffer layer to remove the buffer layer, thereby removing the substrate 101.

After the substrate 101 has been removed, the bottom surface the first conductive semiconductor layer 111 is polished through the ICP/RIE (inductively coupled plasma/reactive ion etching) scheme.

Figure 8:
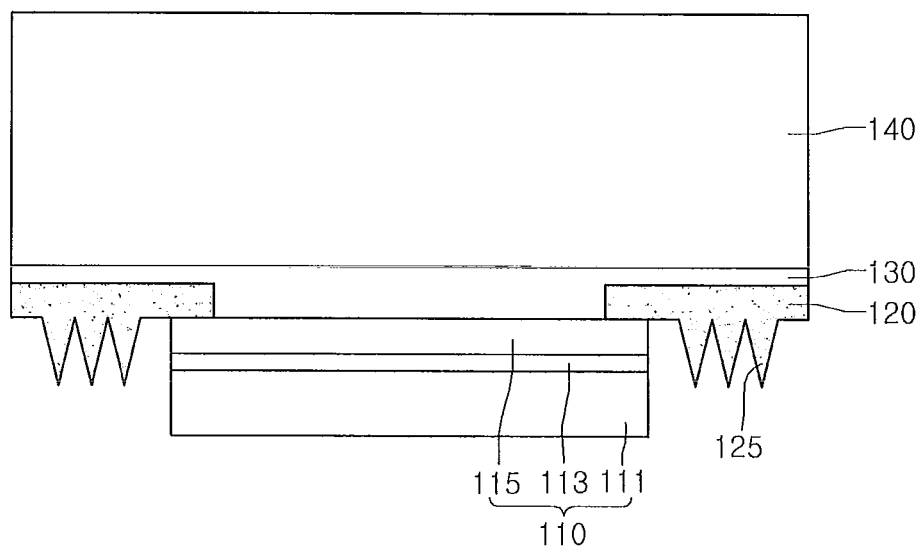
Figure 9:
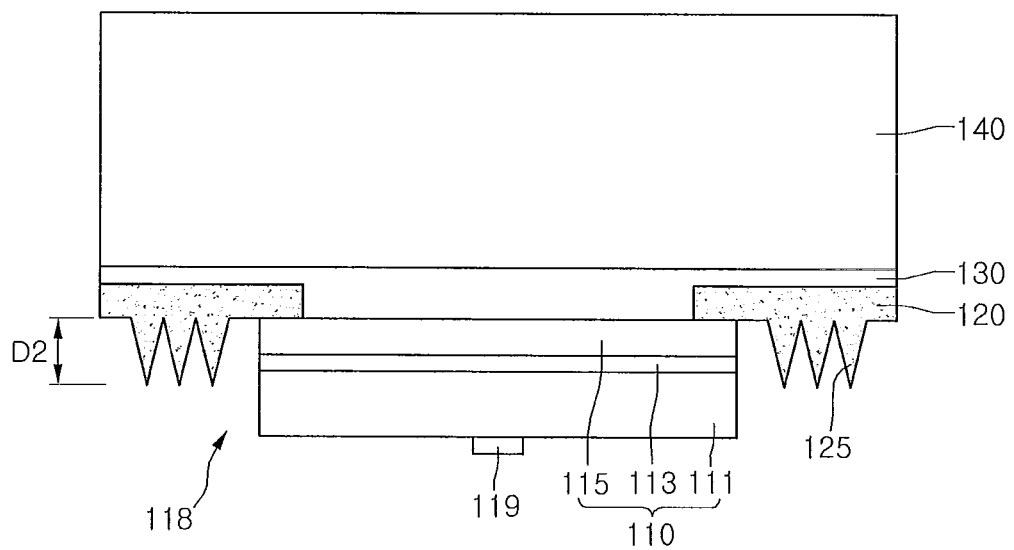

Referring to FIGS. 7 and 8, after the substrate 101 has been removed, a mesa etching is performed to expose an outer lower portion of the channel layer 120 at the chip boundary region. The mesa etching may be the dry etching or the wet etching.

If the channel layer 120 includes conductive material, the light emitting efficiency can be improved due to the ohmic characteristic of the channel layer 120. If the channel layer 120 includes insulating material, the gap between the second electrode 130 and the second conductive semiconductor layer 115 can be widened.

The roughness 125 is exposed along the outer portion of the light emitting structure 110 at the outer lower portion of the channel layer 120. The roughness 125 protrudes such that the roughness 125 can be exposed in the stack direction of the light emitting structure 110.

The first electrode 119 having a predetermined pattern can be formed below the first conductive semiconductor layer 111. The roughness can be formed on the bottom surface of the first conductive semiconductor layer 111. After or before the first electrode 119 has been formed, a dicing process is performed to provide individual chips.

According to the semiconductor light emitting device 110 of the embodiment, the roughness 125 protrudes along the outer peripheral region 118 of the light emitting structure 110 in the stack direction of the light emitting structure 110 at the outer lower portion of the channel layer 120. The roughness 125 can vary the incident angle of the light emitted from the light emitting structure 110 or reflected from the second electrode layer 130 formed below the channel layer 120, thereby improving the external light emitting efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The embodiment is applicable in the light emitting device for supplying light.

What is claimed is:

1. A semiconductor light emitting device, comprising:
   a light emitting structure including a first conductive semiconductor layer, an active layer below the first conductive semiconductor layer, and a second conductive semiconductor layer below the active layer;
   a channel layer below the light emitting structure, in which an inner portion of the channel layer is disposed along an outer peripheral portion of the light emitting structure and an outer portion of the channel layer extends out of the light emitting structure;
   a roughness disposed on the outer portion of the channel layer,
   wherein a height of a top of the roughness is lower than a top of the light emitting structure; and
   a second electrode layer below the light emitting structure, wherein the inner portion of the channel layer is disposed outside of the second electrode layer and under the light emitting structure.

2. The semiconductor light emitting device of claim 1, wherein the channel layer comprises material selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

3. The semiconductor light emitting device of claim 1, wherein the channel layer and the roughness are formed in a single body.

4. The semiconductor light emitting device of claim 1, further comprising a conductive support member below the second electrode layer.

5. The semiconductor light emitting device of claim 1, further comprising a first electrode on the light emitting structure.

6. The semiconductor light emitting device of claim 1, wherein the roughness protrudes from the channel layer by at least 50 nm.

7. The semiconductor light emitting device of claim 1, wherein the roughness comprises at least one of a conical shape, a polygonal shape, and a convex shape.

8. The semiconductor light emitting device of claim 1, wherein the channel layer comprises light transmittive conductive material.

9. The semiconductor light emitting device of claim 1, wherein the channel layer comprises insulating material.

10. The semiconductor light emitting device of claim 1, wherein the top of the roughness is higher than a top surface of the active layer.

11. The semiconductor light emitting device of claim 1, wherein the second electrode layer includes at least one layer including material selected from the group consisting of Ag, Ni, Al, Rh, Pd, Ir, Ru, Mg, Zn, Pt, Au, Hf and combination thereof.

12. A semiconductor light emitting device, comprising:
   a light emitting structure including a first conductive semiconductor layer, an active layer below the first conductive semiconductor layer, and a second conductive semiconductor layer below the active layer;
   a channel layer below the light emitting structure, in which an inner portion of the channel layer is disposed along an outer peripheral portion of the light emitting structure, an outer portion of the channel layer extends out of the light emitting structure, and a roughness is formed on an outer portion of a top surface of the channel layer;
   a first electrode on the light emitting structure; and
   a second electrode layer below the light emitting structure, wherein the inner portion of the channel layer is disposed outside of the second electrode layer and under the light emitting structure, and
   wherein a height of a top of the roughness is lower than a top of the light emitting structure.

13. The semiconductor light emitting device of claim 12, wherein the channel layer comprises material selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

14. The semiconductor light emitting device of claim 12, further comprising a conductive support member below the second electrode layer.

15. The semiconductor light emitting device of claim 12, wherein the roughness protrudes from the channel layer by at least 50 nm.

16. The semiconductor light emitting device of claim 12, wherein the roughness comprises at least one of a conical shape, a polygonal shape, and a convex shape.

17. The semiconductor light emitting device of claim 12, wherein the channel layer comprises light transmittive conductive material or insulating material.

18. The semiconductor light emitting device of claim 12, wherein the top of the roughness is higher than a top surface of the active layer.

19. The semiconductor light emitting device of claim 12, wherein the second electrode layer comprises at least one layer including material selected from the group consisting of Ag, Ni, Al, Rh, Pd, Ir, Ru, Mg, Zn, Pt, Au, Hf and combination thereof.

* * * * *